March 8, 1966 F. H. DILL, JR 3,239,393

METHOD FOR PRODUCING SEMICONDUCTOR ARTICLES

Filed Dec. 31, 1962 2 Sheets-Sheet 1

INVENTOR.
FREDERICK H. DILL JR

BY Curtis Ailes Jr.

ATTORNEY

METHOD FOR PRODUCING SEMICONDUCTOR ARTICLES

Filed Dec. 31, 1962 2 Sheets-Sheet 2

United States Patent Office 3,239,393

Patented Mar. 8, 1966

3,239,393

METHOD FOR PRODUCING SEMICONDUCTOR ARTICLES

Frederick H. Dill, Jr., Putnam Valley, N.Y., assignor to International Business Machines Corporation, New York, N.Y., a corporation of New York Filed Dec. 31, 1962, Ser. No. 248,679
7 Claims. (Cl. 148—189)

This invention relates to an improved diffusion process for the production of semiconductor devices, and more particularly to an improved vapor diffusion process in which the introduction of unwanted impurities is very effectively and simply avoided, and which possesses other advantages contributing to the simple and trouble-free production of articles composed of semiconductor compounds.

In the past, semiconductor devices have been produced almost exclusively from monatomic semiconductor materials. Such materials include, for instance, germanium and silicon as outstanding examples. However, it has recently become apparent that semiconductor compounds possess certain advantages in the production of semiconductor devices and some of these compounds are capable of producing devices having special properties which have not been observed with the monatomic semiconductor materials. For instance, certain Group III–Group V compounds such as gallium arsenide have been shown to display rather marked "laser" properties when properly fabricated in a semiconductor device. The term "laser," as used here, means a device which is capable of operation as an optical maser for converting electrical energy which it receives into a coherent optical light energy output, the output having a very limited wave length spectrum, the conversion being carried out with a high degree of efficiency. The devices disclosed in a copending application Serial No. 234,150, filed on October 30, 1962 by F. H. Dill et al. entitled "Lasers" and assigned to the same assignee as the present application illustrates this utility of semiconductor compounds. The semiconductor compounds, including gallium arsenide, as well as other Group III–Group V semiconductor compounds, and some of the Group II–Group VI semiconductor compounds are also known to be useful semiconductor materials for other more conventional purposes. As used in this specification the term "Group III–Group V compound" means a compound composed of elements selected from Groups III and V of the periodic table.

Some of the most popular methods for producing semiconductor devices employ vapor diffusion for the purpose of introducing junction-forming impurities. However, when using vapor diffusion for the production of semiconductor devices composed of semiconductor compounds, the diffusion must be carried out at an elevated temperature which is likely to cause decomposition of the semiconductor substrate compound. At these temperatures, not only is there likely to be decomposition due to disassociation, but also the substrate constituent elements are likely to combine with impurity elements which may be found in minute quantities within the vapor deposition enclosure.

Accordingly, one of the objects of the present invention is to provide an improved vapor diffusion process for the production of semiconductor devices having compound semiconductor substrates in which the problem of degradation of the surface of the substrate during the diffusion step is overcome.

Another important problem in the process of vapor diffusion of semiconductor compound substrates is that it is very difficult to obtain a perfectly clean and high purity diffusant material in a carefully measured quantity to produce precisely the desired results. For instance, when metallic zinc is used as the diffusant material for a gallium arsenide substrate, it is very difficult to obtain the pure zinc metal with no zinc oxide film upon the metal. Furthermore, the metal is so tough that it is difficult to divide a pure metal sample into smaller pieces in order to obtain exactly the correct quantity for the diffusion process. The zinc oxide on the surface of the metallic zinc diffusant material is very undesirable for a number of reasons. The oxygen is not wanted in the diffusion vapor, and the zinc oxide tends to form a protective coating over the zinc which inhibits the formation of the desired zinc metal vapor which is required for the diffusion process.

Accordingly, it is another important object of this invention to provide an improved vapor diffusion process for the production of semiconductor devices employing semiconductor compound substrates in which the problems related to the use of a pure metallic diffusant are overcome.

Stated very concisely, therefore, it is an object of the present invention to provide an improved vapor diffusion process for producing electrical semiconductor devices formed from semiconductor compound substrates and for assuring a clean and uncontaminated source of diffusant material and a very effective protective atmosphere for the vapor diffusion process.

In carrying out the objects of this invention in one preferred form of the method, a substrate crystal composed of an electrical semiconductor device compound is heated in the presence of a vapor consisting essentially of the decomposition products of a compound of an acceptor cation element and an anion element from the same group in the periodic table as the anion of the substrate compound.

The concentration of the acceptor cation element diffusant in the vapor is maintained at a low value such that no substantial alloying or plating will occur.

Further objects and advantages of this invention will be apparent from the following description and the accompanying drawings which are briefly described as follows.

Figure 3:
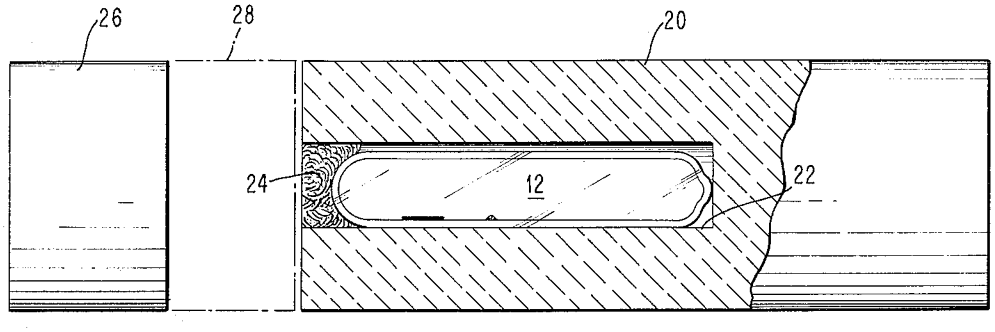

And FIG. 3 illustrates apparatus employed in the diffusion step in practicing a preferred form of the process.

Figure 1:
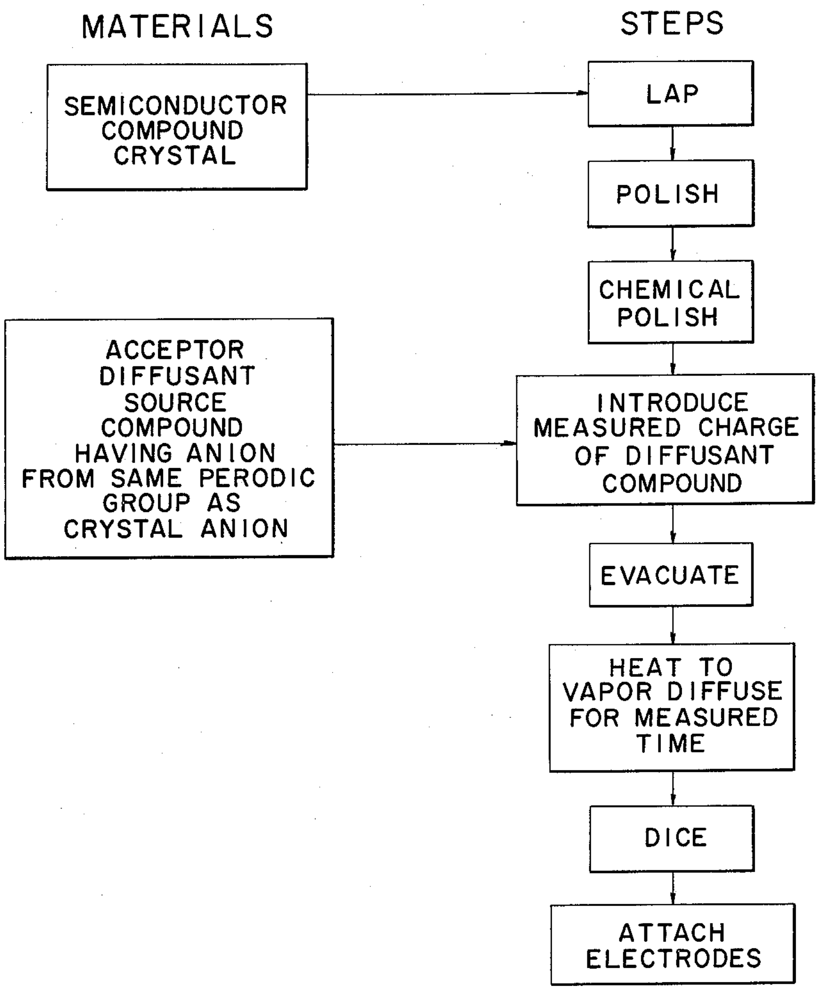
FIG. 1 is a flow diagram indicating the materials and steps which are employed in carrying out one form of the method of this invention.

Referring in more detail to FIG. 1, the semiconductor compound crystal which serves as the substrate is preferably lapped, polished, and chemically polished. An acceptor diffusant source compound having an anion which is the same as the crystal anion or at least from the same periodic group is then introduced into the presence of the semiconductor compound crystal in a carefully measured charge. The two materials are placed in an enclosure which is evacuated and then heated for a measured time to accomplish the desired vapor diffusion. The diffused crystal is then preferably diced to divide it into a number of separate devices and suitable electrodes are attached to each device. The electrodes may be provided by alloying at the surfaces of the device, or by other known methods. It will be understood that this exemplification of the process may be modified substantially without departing from the spirit of the invention. Thus, certain steps may be combined with others or eliminated as will appear more clearly from the remainder of the specification and the claims. For instance, for a deep diffusion penetration of a depth which substantially exceeds the depth of individual surface imperfections of a lapped surface, the polishing steps may be omitted, because the lapped surface is sufficiently smooth.

Figure 2:
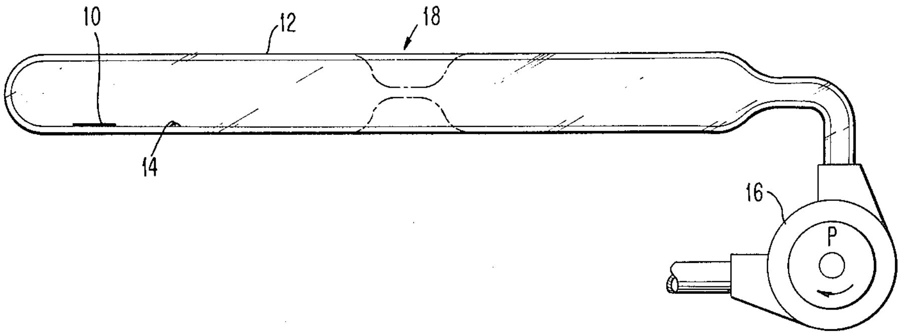
FIG. 2 illustrates the apparatus employed in carrying out the preliminary steps in practicing a preferred form of the process of this invention.

The following illustrates in more detail a preferred example of the procedures followed to carry out the method of the present invention. A slice from an "N" type gallium arsenide crystal is lapped, polished, and then chemically polished to produce a very smooth flat surface for the diffusion. The crystal wafer may be in a disc shape having a diameter of about 10 millimeters and a thickness of about 0.5 millimeter. As indicated in FIG. 2, the substrate 10 is placed in a quartz tube 12 having an inside diameter of approximately 11 millimeters together with a charge 14 of zinc arsenide ($ZnAs_2$). A typical charge of zinc arsenide is approximately 0.6 milligram. However, the charge quantity may be in a wide range from 0.01 milligram to 10 milligrams depending upon the amount of doping which is desired. The quartz tube 12 is evacuated to a pressure of less than $10^{-6}$ millimeters of mercury by the vacuum pump indicated at 16, and then it is sealed off as indicated at 18 at a tube length of approximately 75 millimeters. The resultant quartz tube capsule then encloses a volume of approximately six cubic centimeters.

As shown in FIG. 3, the capsule 12 is then inserted into a firebrick crucible 20 which has a cylindrical outer shape and a central opening 22 which is somewhat longer than the capsule. After the insertion of the capsule, a small wad of fibrous aluminum silicate "cotton" 24 is stuffed in the end of the opening, and the crucible 20 is then inserted together with a cover cylinder 26 into a tube furnace and heated to a temperature of about 850° C. The cover 26 is placed over the opening 22 as indicated at 28. The crucible 20 together with the cover 26 substantially completely fill the interior of the tube furnace.

Preferred temperatures for this process range from approximately 750° C. to 950° C. The diffusion time which is required is a function of the diffusion depth which is desired and also the diffusion temperature which is maintained. The size of the diffusant compound charge is another related variable. With the specific conditions previously given for this example, the diffusion may be carried out for sixteen hours in order to obtain a diffusion depth of fifty microns. Under similar conditions, with cadmium arsenide ($Cd_3As_2$) as the diffusant source, eighty hours are required to achieve a diffusion of the cadmium to a depth of fifty microns. Successful devices having PN junctions at diffusion depths from five microns to 125 microns have been achieved by this process.

The isothermal heating described above is preferred in carrying out the method of this invention. However, other forms of heating may be successfully employed.

The semiconductor substrate materials which are useful in the practice of the method of the present invention may include any of the semiconductor compounds which are useful in the production of electrical semiconductor devices. For instance, these may include, but are not necessarily limited to, the following Group III–Group V compounds in addition to gallium arsenide: indium antimonide, gallium phosphide, gallium antimonide, and indium arsenide. The method of the present invention may also be practiced employing semiconductor substrates composed of semiconductor compounds the elements of which are chosen from other groups in the periodic table. For instance, Group II–Group VI semiconductor compounds may be employed such as cadmium sulphide or cadmium selenide. The so-called mixed crystals including more than one type of ion from one of the combining groups may also be employed in the practice of this invention. For instance, in the Group III–Group V category, gallium arsenide phosphide, $Ga(As_xP_{(1-x)})$, may be employed.

In each case, a diffusant compound is employed which has a disassociation pressure higher than that of the substrate compound and the anion of the diffusant compound is always chosen to be from the same group in the periodic table as the anion of the substrate compound. Furthermore, the cation of the diffusant compound is always chosen from a lower group in the periodic table so as to act as an acceptor. For instance, with a substrate of gallium arsenide, zinc arsenide or cadmium arsenide have been found to be very effective diffusant sources. The arsenic component of the diffusant serves to form a protective arsenic vapor atmosphere during the diffusion process, and the zinc or the cadmium serve as an acceptor material in the actual diffusion of the semiconductor surface. With a Group II–Group VI substrate compound, such as zinc selenide, a copper selenide diffusant material is appropriate, with the copper serving as the acceptor material.

The use of a compound as a diffusant source has a number of advantages. For instance, when zinc arsenide is used as a diffusant source instead of pure zinc metal, the zinc arsenide is much easier to handle because it is chemically more stable and it is much more brittle and easier to subdivide in order to obtain precise measurements of very small charges. Furthermore, the disassociation of the zinc arsenide in the course of the diffusion process provides an arsenic vapor within the diffusion capsule enclosure. This arsenic vapor serves to prevent the disassociation of the gallium arsenide during the diffusion process. The freed zinc metal constituent serves as the acceptor diffusant in the gallium arsenide crystal. It is preferred that the anion of the diffusant source compound should be of the same element as the anion of the substrate crystal compound, for this combination is most effective in preventing disassociation of the crystal compound. However, it has been found that if the anion element is chosen from the same group of the periodic table, the anion element in the vapor diffusion atmosphere is still quite effective to prevent disassociation and acceptable results are obtained. For instance, zinc arsenide has been used successfully as a diffusant source for gallium phosphide crystals.

The problems to which the present invention is addressed have been extremely difficult ones which have led to many failures. Various prior proposals for solutions to these problems have been relatively unsuccessful. For instance, in the diffusion of gallium arsenide crystals, it has been proposed that quantities of crushed gallium arsenide be introduced into the vapor diffusion enclosure on the theory that the total degradation of the gallium arsenide would be reduced by the presence of the additional gallium arsenide, and the degradation of the desired gallium arsenide crystal would, therefore, be kept within limits. However, this arrangement merely reduces the problem of gallium arsenide degradation, and does not solve the problem.

It has also been proposed to introduce pure metallic acceptor material together with pure arsenic as a protective vapor atmosphere producing material. However, both of these materials combine so readily with oxygen, and they are so difficult to obtain in completely pure form with complete freedom from oxygen and other contaminants that this proposal has been unsucessful.

By contrast, the present invention solves these multiple problems by a single choice of a diffusant compound material. The cadmium arsenide and the zinc arsenide are particularly favorable choices as diffusant materials for gallium arsenide. An auxiliary reason for this is that these materials are susceptible to simple electrical tests which serve as good indications as to their purity. Accordingly, the purity of these arsenide diffusant compounds being readily determinable, the success of the results of the diffusion process is much more definitely predictable. Furthermore, as suggested above, these salts are more easily obtained and maintained in a pure form because they oxidize much less readily than the pure metallic acceptor diffusant. Another advantage derives from the brittleness of these salts. Thus it is quite simple to limit the harge of diffusant compound to particles having fresh fractured surfaces which have not had a chance to form oxides.

While the invention has been particularly shown and described with reference to preferred embodiments thereof, it will be understood by those skilled in the art that various changes in form and details may be made therein without departing from the spirit and scope of the invention.

What is claimed is:

1. A method for producing semiconductor devices by vapor diffusion comprising heating a gallium arsenide substrate crystal in an evacuated chamber together with a charge of a compound selected from the class including zinc arsenide and cadmium arsenide to serve as a source of diffusant.

2. An improved method for producing semiconductor devices by vapor diffusion comprising the steps of placing in an enclosure a polished substrate crystal comprised of a semiconductor compound which is useful for electrical semiconductor devices, together with a charge of an acceptor diffusant compound having a cation which is an acceptor for the substrate compound and having as an anion the same anion as the substrate compound, evacuating said enclosure, sealing said enclosure while under evacuation, and then heating said materials within the enclosure at a temperature in the range of from about 750° to 950° C. and for a period sufficient to produce the desired diffusion depth.

3. An improved method for producing semiconductor devices by vapor diffusion comprising the steps of placing in an enclosure a polished substrate comprised of a semiconductor compound which is useful for electrical semiconductor devices selected from the class including Group III–Group V and Group II–Group VI compounds, together with a charge of an acceptor diffusant compound having a higher disassociation pressure than the substrate compound and having a cation which is an acceptor for the substrate compound and having an anion from the same group as the anion of the substrate compound, evacuating said enclosure, sealing said enclosure while under evacuation, and then heating said materials within the enclosure at a temperature in the range of from about 750° to 950° C. and for a period sufficient to produce the desired diffusion depth.

4. An improved method for producing semiconductor devices by vapor diffusion comprising the steps of placing in an enclosure a polished substrate comprised of a semiconductor compound which is useful for electrical semiconductor devices selected from the class of compounds composed of elements to be found in Group III and Group V of the periodic table, together with a charge of a diffusant compound having a cation which is an acceptor for the substrate compound and having an anion selected from Group V of the periodic table, evacuating said enclosure, sealing said enclosure while under evacuation, and then heating said materials within the enclosure at a temperature in the range of from about 750° to 950° C. and for a period sufficient to produce the desired diffusion depth.

5. An improved method for producing semiconductor devices by vapor diffusion comprising the steps of placing in an enclosure a polished substrate comprised of a semiconductor compound which is useful for electrical semiconductor devices selected from the class of compounds composed of elements to be found in Group II and Group VI of the periodic table, together with a charge of a diffusant compound having a cation which is an acceptor for the stubstrate compound and having an anion selected from Group VI of the periodic table, evacuating said enclosure, sealing said enclosure while under evacuation, and then heating said materials within the enclosure at a temperature in the range of from about 750° to 950° C. and for a period sufficient to produce the desired diffusion depth.

6. An improved method for producing semiconductor devices by vapor diffusion comprising the steps of placing in an enclosure a polished substrate comprised of a semiconductor compound which is useful for electrical semiconductor devices selected from the class including Group III–Group V and Group II–Group VI compounds, together with a charge of an acceptor diffusant compound having a higher disassociation pressure than the substrate compound and having a cation which is an acceptor for the substrate compound and having as an anion the same anion as the substrate compound, evacuating said enclosure, sealing said enclosure while under evacuation, and then heating said materials within the enclosure at a temperature in the range of from about 750° to 950° C. and for a period sufficient to produce the desired diffusion depth.

7. An improved method for producing semiconductor devices by isothermal vapor diffusion comprising the steps of lapping and polishing a gallium arsenide substrate crystal, placing the polished substrate in an enclosure together with a charge of a diffusant compound which is sufficient to produce the desired diffusion depth, the diffusant compound being selected from the class including zinc arsenide and cadmium arsenide, evacuating said enclosure, sealing said enclosure while under evacuation, and then heating said materials within the enclosure at a temperature in the range of from about 750° to 950° C. and for a period sufficient to produce the desired diffusion depth.

References Cited by the Applicant

UNITED STATES PATENTS

| | | | |
|---|---|---|---|
| 2,846,340 | 8/1958 | Jenny | 148—189 X |
| 2,868,678 | 1/1959 | Shockley | 148—189 |
| 2,900,286 | 8/1959 | Goldstein | 148—189 |
| 2,928,761 | 3/1960 | Gremmelmaier | 148—189 |
| 2,929,859 | 3/1960 | Loferski | 148—189 |
| 3,096,219 | 7/1963 | Nelson | 148—189 X |

DAVID L. RECK, *Primary Examiner.*

BENJAMIN HENKIN, *Examiner.*